US008860029B2

(12) United States Patent
Nagi et al.

(10) Patent No.: US 8,860,029 B2
(45) Date of Patent: Oct. 14, 2014

(54) PHOTOELECTRIC CONVERISON ELEMENT, PHOTOELECTRIC CONVERSION CIRCUIT, AND DISPLAY DEVICE

(71) Applicant: Semiconductor Energy Laboratory Co., Ltd., Atsugi (JP)

(72) Inventors: Tsudoi Nagi, Kanagawa (JP); Koji Dairiki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/959,774

(22) Filed: Aug. 6, 2013

(65) Prior Publication Data
US 2013/0313555 A1     Nov. 28, 2013

Related U.S. Application Data

(62) Division of application No. 13/311,665, filed on Dec. 6, 2011, now Pat. No. 8,519,397.

(30) Foreign Application Priority Data

Dec. 10, 2010 (JP) ................................. 2010-275311

(51) Int. Cl.
| | |
|---|---|
| *H01L 29/04* | (2006.01) |
| *H01L 29/10* | (2006.01) |
| *H01L 31/0232* | (2014.01) |
| *H01L 27/12* | (2006.01) |
| *H01L 29/66* | (2006.01) |
| *H01L 31/102* | (2006.01) |
| *H01L 31/20* | (2006.01) |

(52) U.S. Cl.
CPC .......... *H01L 31/02327* (2013.01); *H01L 27/12* (2013.01); *H01L 29/66757* (2013.01); *H01L 27/1214* (2013.01); *H01L 31/102* (2013.01); *H01L 31/20* (2013.01)
USPC .............................. 257/61; 257/352; 257/353

(58) Field of Classification Search
CPC ................. H01L 27/1214; H01L 27/12; H01L 29/66757
USPC .............................................. 257/61, 352, 353
See application file for complete search history.

(56) References Cited

U.S. PATENT DOCUMENTS

| | | | | |
|---|---|---|---|---|
| 8,313,980 B2 | 11/2012 | Akimoto | | |
| 8,519,397 B2 * | 8/2013 | Nagi et al. | ...................... | 257/59 |

(Continued)

FOREIGN PATENT DOCUMENTS

| | | |
|---|---|---|
| JP | 11-095263 | 4/1999 |
| JP | 2001-036060 | 2/2001 |

(Continued)

OTHER PUBLICATIONS

Arai et al., "41.2: Micro Silicon Technology for Active Matrix OLED Display", SID Digest 07: SID International Symposium Digest of Technical Papers, 2007, vol. 38, pp. 1370-1373.

(Continued)

*Primary Examiner* — Ngan Ngo
(74) *Attorney, Agent, or Firm* — Nixon Peabody LLP; Jeffrey L. Costellia

(57) ABSTRACT

A photoelectric conversion element including a first gate electrode, a first gate insulating layer, a crystalline semiconductor layer, an amorphous semiconductor layer, an impurity semiconductor layer, a source electrode and a drain electrode in contact with the impurity semiconductor layer, a second gate insulating layer covering a region between the source electrode and the drain electrode, and a second gate electrode over the second gate insulating layer. In the photoelectric conversion element, a light-receiving portion is provided in the region between the source electrode and the drain electrode, the first gate electrode includes a light-shielding material and overlaps with the entire surface of the crystalline semiconductor layer and the amorphous semiconductor layer, the second gate electrode includes a light-transmitting material and overlaps with the light-receiving portion, and the first gate electrode is electrically connected to the source electrode or the drain electrode is provided.

15 Claims, 9 Drawing Sheets

(56) References Cited

U.S. PATENT DOCUMENTS

| | | | |
|---|---|---|---|
| 8,716,061 B2* | 5/2014 | Yamazaki et al. | 438/104 |
| 2004/0147065 A1 | 7/2004 | Kitakado et al. | |
| 2008/0074401 A1 | 3/2008 | Chung et al. | |
| 2008/0252618 A1 | 10/2008 | Chung et al. | |
| 2010/0216285 A1 | 8/2010 | Yokoi et al. | |
| 2011/0318875 A1 | 12/2011 | Yamazaki et al. | |
| 2012/0032177 A1 | 2/2012 | Hosoya | |
| 2012/0129288 A1 | 5/2012 | Kobayashi et al. | |
| 2012/0319108 A1 | 12/2012 | Sakata et al. | |
| 2013/0153895 A1* | 6/2013 | Yamazaki et al. | 257/43 |
| 2013/0328044 A1* | 12/2013 | Yamazaki et al. | 257/43 |
| 2014/0087517 A1* | 3/2014 | Akimoto et al. | 438/104 |

FOREIGN PATENT DOCUMENTS

| | | |
|---|---|---|
| JP | 2001-217424 | 8/2001 |
| JP | 2009-086565 | 4/2009 |
| JP | 2009-093050 | 4/2009 |

OTHER PUBLICATIONS

Lee et al., "How to Achieve High Mobility Thin Film Transistors by Direct Deposition of Silicon Using 13.56 MHz RF PECVD?", IEDM 06: Technical Digest of International Electron Devices Meeting, Dec. 11, 2006, pp. 295-298.

Lee et al., "Directly deposited nanocrystalline silicon thin-film transistors with ultra high mobilities" Applied Physics Letters, Dec. 18, 2006, vol. 89, No. 25, pp. 252101-1-252101-3.

Lee et al., "High-mobility nanocrystalline silicon thin-film transistors fabricated by plasma-enhanced chemical vapor deposition", Applied Physics Letters, May 24, 2005, vol. 86, pp. 222106-1-222106-3.

Lee et al., "High Mobility N-Channel and P-Channel Nanocrystalline Silicon Thin-Film Transistors", IEDM 05: Technical Digest of International Electron Devices Meeting, 2005, pp. 937-940.

Esmaeili-Rad et al., High Stability, Low Leakage Nanocrystalline Silicon Bottom Gate Thin Film Transistors for AMOLED Displays, IEDM 06: Technical Digest of International Electron Devices Meeting, 2006, pp. 303-306.

Lee et al., "Leakage current mechanisms in top-gate nanocrystalline silicon thin film transistors", Applied Physics Letters, Feb. 28, 2008, vol. 92, pp. 083509-1-083509-3.

Esmaeili-Rad et al., "Absence of defect state creation in nanocrystalline silicon thin film transistors deduced from constant current stress measurements", Applied Physics Letter, Sep. 12, 2007, vol. 91, No. 11, pp. 113511-1-113511-3.

Lee et al., " Stability of nc-Si:H TFTs With Silicon Nitride Gate Dielectric" IEEE Transactions on Electron Devices, 2007, vol. 54, No. 1, pp. 45-51.

Sazonov et al., "Low-Temperature Materials and Thin Film Transistors for Flexible Electronics", Proceedings of the IEEE, Aug. 1, 2005, vol. 93, No. 8, pp. 1420-1428.

Lee et al.,"Postdeposition thermal annealing and material stability of 75 °C hydrogenated nanocrystalline silicon plasma-enhanced chemical vapor deposition films", Journal of Applied Physics, Aug. 4, 2005, vol. 98, No. 3, pp. 034305-1-034305-7.

\* cited by examiner

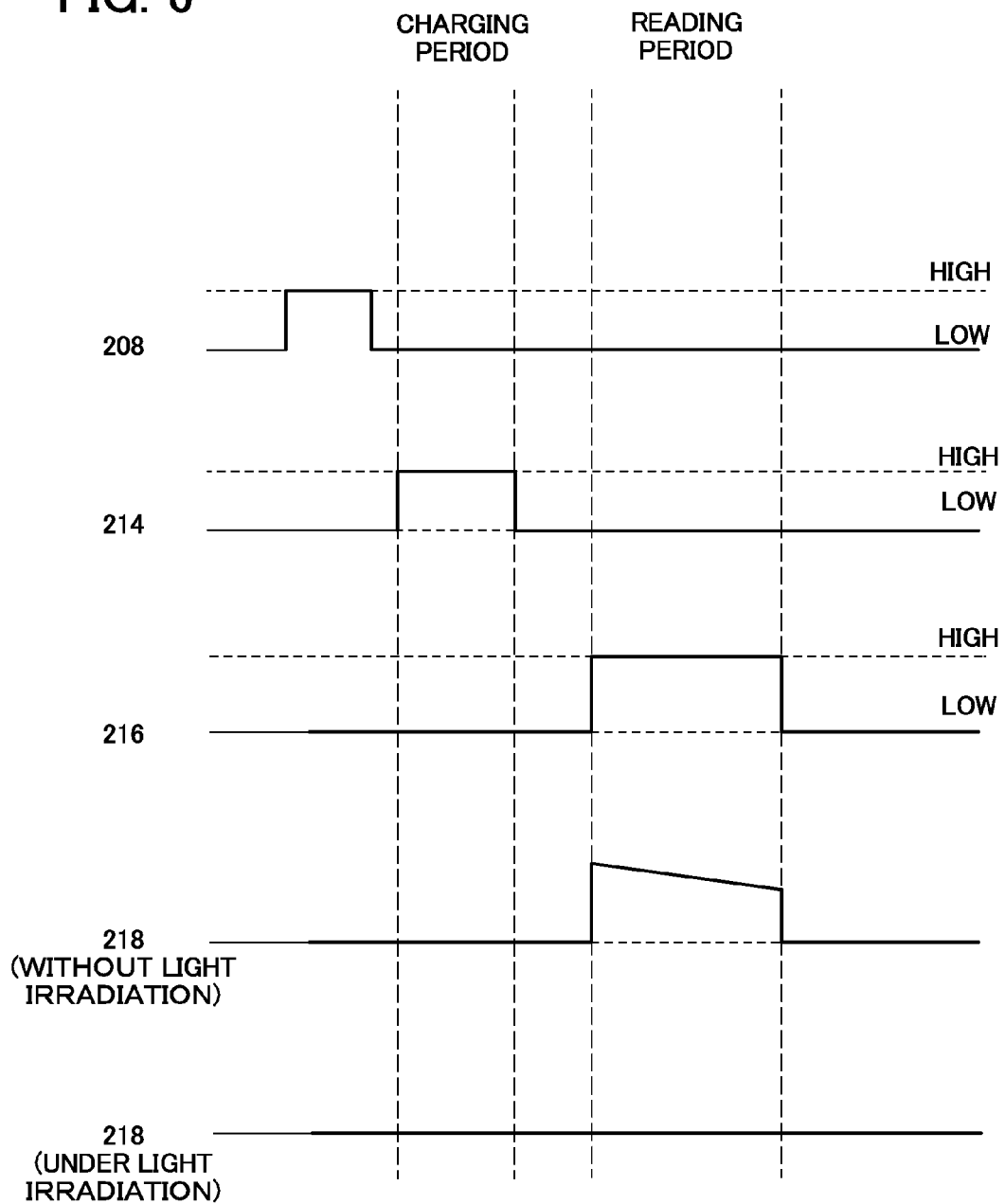

PHOTOELECTRIC CONVERISON ELEMENT, PHOTOELECTRIC CONVERSION CIRCUIT, AND DISPLAY DEVICE

BACKGROUND OF THE INVENTION

1. Field of the Invention

The present invention relates to a photoelectric conversion element. Moreover, the present invention relates to a photoelectric conversion circuit including the photoelectric conversion element, and a display device including the photoelectric conversion circuit.

2. Description of the Related Art

Nowadays, semiconductor devices are indispensable to human life. Semiconductor elements, such as thin film transistors included in semiconductor devices are manufactured in such a manner that a semiconductor film is formed over a substrate and the semiconductor film is processed into a desired shape by a photolithography method or the like. Such a manufacturing method is used for forming a liquid crystal display device (e.g., a liquid crystal television) or the like.

An amorphous silicon film has been often used as a semiconductor film in a thin film transistor of a conventional liquid crystal television. This is because a structure of a thin film transistor formed using an amorphous silicon film is thought to be manufactured with relative ease. However, when the current circumstances of moving images (e.g., watching movies and sports in 3D) are taken into account, a thin film transistor which responds at higher speed than those using an amorphous silicon film has been developed. For example, a thin film transistor using a microcrystalline silicon film has been developed (e.g., Patent Document 1).

On the other hand, an optical touch panel has been developed. However, a current touch panel has problems that material cost is high and yield is not favorable, because a light-receiving element is generally formed over a substrate which is different from a substrate of a display panel and mounted.

Thus, attempts to form a pixel with the use of a thin film transistor using a microcrystalline silicon film and realize a photoelectric conversion element formed in the same step as the thin film transistor (e.g., Patent Documents 2 and 3) have been made. Note that a photoelectric conversion element having a dual-gate structure in which a back gate is provided has been disclosed (e.g., Patent Document 4).

REFERENCE

Patent Document

[Patent Document 1] Japanese Published Patent Application No. 2001-217424
[Patent Document 2] Japanese Published Patent Application No. 2009-086565
[Patent Document 3] Japanese Published Patent Application No. 2009-093050
[Patent Document 4] Japanese Published Patent Application No. 2001-036060

SUMMARY OF THE INVENTION

In the thin film transistor using a crystalline semiconductor film for a light-receiving portion, a crystalline semiconductor layer on a side opposite to the light-receiving portion needs to be shielded from light. This is for prevention of generation of photocurrent in the light-receiving portion by unintended external light or stray light. Since the crystalline semiconductor layer has higher carrier mobility than an amorphous semiconductor layer and electrons which are absorbed due to irradiation of the end portion of the crystalline semiconductor layer with light can be converted into current efficiently, it is necessary that the crystalline semiconductor layer is more completely shielded from light than the thin film transistor using the amorphous semiconductor layer as a channel formation region. Therefore, a light-shielding layer may be provided in a portion overlapped with the crystalline semiconductor layer which becomes the light-receiving portion. However, in the case where the light-shielding layer is a metal layer having a high work function such as a Ti layer, current which passes through the crystalline semiconductor layer is generated by a potential of the light-shielding layer. Therefore, current with no light supplied becomes large, SN ratio is reduced.

An object of one embodiment of the present invention is to provide a photoelectric conversion element which can operate keeping a high SN ratio without malfunction even if a thin film overlapped with a light-receiving portion is a crystalline semiconductor layer.

Further, in a conventional photoelectric conversion element using a crystalline semiconductor film, data of the photoelectric conversion element is read at the same timing as that of a pixel transistor, and a potential of a reading line (an output potential) is kept high except for the reading time of data of the photoelectric conversion element, so that a reading period of the irradiated photoelectric conversion element is very short. In the photoelectric conversion element provided to have the same thickness as the thin film transistor (about 10 nm to 300 nm), when a short reading period makes it difficult to perform reading.

Note that, a "pixel transistor" refers to one of thin film transistors which are arranged in a matrix in a display device, and used for switching of a pixel. One of a source and a drain of the pixel transistor is electrically connected to one wiring, and the other of the source and the drain of the pixel transistor is electrically connected to a pixel electrode.

An object of one embodiment of the present invention is to provide a photoelectric conversion circuit which can secure a sufficient reading period of an irradiated photoelectric conversion element and a display device including the photoelectric conversion circuit.

One embodiment of the present invention is a photoelectric conversion element in which at least a crystalline semiconductor layer is used for a light-receiving portion, a light-transmitting control electrode with the crystalline semiconductor layer and an insulating layer provided between is included on a light-receiving side of the crystalline semiconductor layer, a metal layer formed using a light-shielding material is included on the opposite side to the light-transmitting control electrode, and the metal layer is overlapped with the entire surface of the crystalline semiconductor layer; a photoelectric conversion circuit using the photoelectric conversion element; or a display device using the photoelectric conversion element or the photoelectric conversion circuit.

One embodiment of the present invention is a photoelectric conversion element including: a first gate electrode; a first gate insulating layer provided to cover the first gate electrode; a crystalline semiconductor layer provided over the first gate insulating layer; amorphous semiconductor layers provided apart from each other on and in contact with part of the crystalline semiconductor layer; an impurity semiconductor layer provided over the amorphous semiconductor layer; a source electrode and a drain electrode provided in contact with at least the impurity semiconductor layer; a second gate insulating layer provided to cover a portion of the crystalline semiconductor layer, where at least the amorphous semiconductor layers are not provided; and a second gate electrode provided over the second gate insulating layer, wherein a light-receiving portion is provided in a portion of the crystalline semiconductor layer, where the amorphous semiconductor layers are not provided, the first gate electrode includes a light-shielding material and is provided to overlap with the entire surface of the crystalline semiconductor layer and the amorphous semiconductor layers, the second gate electrode includes a light-transmitting material and is provided to overlap with the light-receiving portion, and the first gate electrode is electrically connected to the source electrode or the drain electrode.

Another embodiment of the present invention is a photoelectric conversion element including: a first gate electrode; a first gate insulating layer provided to cover the first gate electrode; a crystalline semiconductor layer provided over the first gate insulating layer; an amorphous semiconductor layer provided in contact with the crystalline semiconductor layer; impurity semiconductor layers provided apart from each other over part of the amorphous semiconductor layer; a source electrode and a drain electrode provided in contact with at least the impurity semiconductor layer; a second gate insulating layer provided to cover a portion of the crystalline semiconductor layer, where at least the amorphous semiconductor layer is not provided; and a second gate electrode provided over the second gate insulating layer, wherein a light-receiving portion is provided in a portion of the crystalline semiconductor layer and the amorphous semiconductor layer, where the impurity semiconductor layers are not provided, the first gate electrode includes a light-shielding material and is provided to overlap with the entire surface of the crystalline semiconductor layer and the amorphous semiconductor layer, the second gate electrode includes a light-transmitting material and is provided to overlap with the light-receiving portion, and the first gate electrode is electrically connected to the source electrode and the drain electrode.

Another embodiment of the present invention is a photoelectric conversion circuit including: the photoelectric conversion element according to one embodiment of the present invention, in which a gate is electrically connected to a reset line and one of a source and a drain is electrically connected to the gate; a storage capacitor in which the other of the source and the drain of the photoelectric conversion element is electrically connected to a first electrode and a common potential line is electrically connected to a second electrode; a first thin film transistor in which a gate is electrically connected to the other of the source and the drain of the photoelectric conversion element and one of a source and a drain is electrically connected to a power supply potential line; and a second thin film transistor in which a gate is electrically connected to a select line, one of a source and a drain is electrically connected to the other of the source and the drain of the first thin film transistor, and the other of the source and the drain is electrically connected to a reading line.

The photoelectric conversion circuit having the above-described structure can be mounted on a display device.

Note that in this specification, a "film" refers to a film which is formed over the entire surface over which the film is formed by a CVD method (including a plasma CVD method and the like), a sputtering method, or the like. On the other hand, a "layer" refers to a layer which is formed by processing a "film" or a layer which is formed over the entire surface over which the layer is formed and does not require to be subjected to processing. However, a "film" and a "layer" do not have to be particularly distinguished.

According to one embodiment of the present invention, the photoelectric conversion element can operate keeping a high SN ratio without malfunction even if the photoelectric conversion element uses a thin crystalline semiconductor layer overlapped with a light-receiving portion.

According to one embodiment of the present invention, a photoelectric conversion circuit which can secure a sufficient reading period of an irradiated photoelectric conversion element and a display device including the photoelectric conversion circuit can be obtained.

BRIEF DESCRIPTION OF THE DRAWINGS

In the accompanying drawings:

FIG. 6 is a timing chart illustrating an operation of the photoelectric conversion circuit in FIGS. 5A and 5B;

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below. Note that an insulating film and an insulating layer are not illustrated in a top view in some cases.

(Embodiment 1)

In this embodiment, a method for manufacturing a photoelectric conversion element that is one embodiment of the present invention will be described with reference to drawings.

Figure 1A:
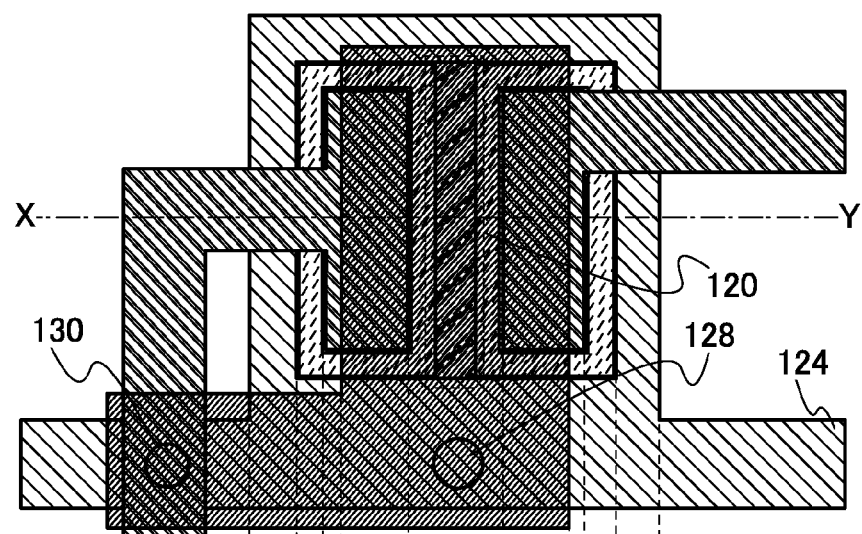
FIGS. 1A and 1B are diagrams illustrating a photoelectric conversion element according to one embodiment of the present invention.
Figure 1B:
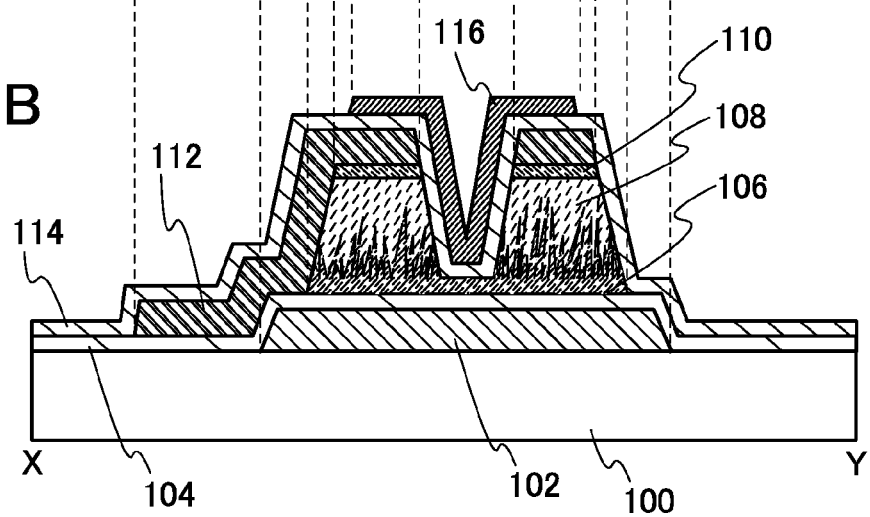

FIGS. 1A and 1B illustrate a photoelectric conversion element according to one embodiment of the present invention. The photoelectric conversion element in FIGS. 1A and 1B includes a first conductive layer 102 provided over a substrate 100; a first insulating layer 104 provided so as to cover the first conductive layer 102; a crystalline semiconductor layer 106 (e.g., a microcrystalline semiconductor layer) provided over the first insulating layer 104; layers 108 containing an amorphous semiconductor provided over the crystalline semiconductor layer 106 and apart from each other; an impurity semiconductor layer 110 provided over the layer 108 containing an amorphous semiconductor; a second conductive layer 112 provided over the impurity semiconductor layer 110; a second insulating layer 114 provided so as to cover at least the crystalline semiconductor layer 106 and the second conductive layer 112; and a third conductive layer 116 provided over the second insulating layer 114.

The first insulating layer 104 and the second insulating layer 114 include a first opening portion 128. The second insulating layer 114 includes a second opening portion 130. The first opening portion 128 is provided to overlap with a wiring 124 formed using the first conductive layer 102, and in the first opening portion 128, the first conductive layer 102 and the third conductive layer 116 are provided in contact with each other. The second opening portion 130 is provided to overlap with one of a source electrode and a drain electrode formed using the second conductive layer 112, and in the second opening portion 130, the second conductive layer 112 is provided in contact with the third conductive layer 116.

In the case where a potential of a second gate electrode is controlled independently from that of a first gate electrode, the first conductive layer 102 is not necessarily electrically connected to the third conductive layer 116.

The first conductive layer 102 is formed using a light-shielding material and is used for forming at least the first gate electrode. The first gate electrode is provided to overlap with the entire surface of the crystalline semiconductor layer 106 and the layer 108 containing an amorphous semiconductor.

The third conductive layer 116 is formed using a light-transmitting material and is used for forming at least the second gate electrode. The second gate electrode is provided to overlap with a light-receiving portion 120 formed using a light-transmitting material.

Further, the first gate electrode is provided in contact with the third conductive layer 116 in the first opening portion 128, one of the source electrode and the drain electrode formed using the second conductive layer 112 is provided in contact with the third conductive layer 116 in the second opening portion 130, and the first gate electrode is electrically connected to one of the source electrode and the drain electrode formed using the second conductive layer 112.

The photoelectric conversion element illustrated in FIGS. 1A and 1B can be manufactured over the same substrate as a pixel of a display device through the same process as a pixel transistor. That is because the photoelectric conversion element illustrated in FIGS. 1A and 1B is obtained by modifying the pixel transistor of the display device. A method for manufacturing the photoelectric conversion element in FIGS. 1A and 1B and the pixel transistor of the display device will be described below.

Figure 2A:
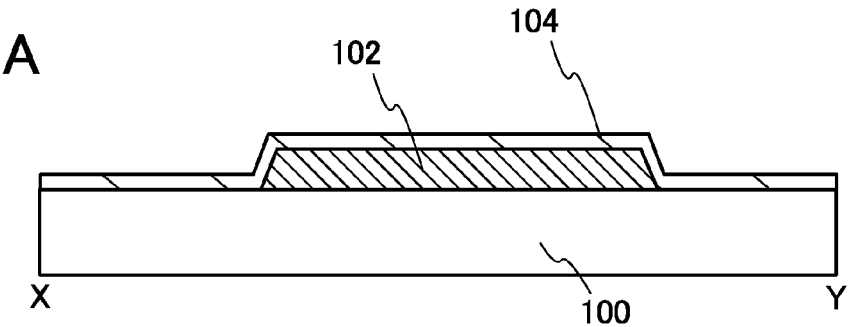
FIGS. 2A to 2D are first diagrams illustrating a method for manufacturing the photoelectric conversion element in FIGS. 1A and 1B and a method for manufacturing a thin film transistor provided over the same substrate.

First, the first conductive layer 102 is formed over the substrate 100, and the first insulating layer 104 is formed so as to cover the first conductive layer 102 (FIG. 2A).

The substrate 100 is an insulating substrate. A light-transmitting substrate such as a glass substrate or a quartz substrate can be used as the substrate 100. A glass substrate is used in this embodiment. In the case where the substrate 100 is mother glass, the substrate may have any of the sizes from the first generation (e.g., 320 mm×400 mm) to the tenth generation (e.g., 2950 mm×3400 mm); however, the substrate is not limited thereto.

The first conductive layer 102 may be formed in such a manner that a light-shielding conductive film (e.g., a metal film or a semiconductor film to which an impurity element imparting one conductivity type is added) is formed, a resist mask is formed over the light-shielding conductive film, and etching is performed using the resist mask. Alternatively, the first conductive layer 102 may be formed using an ink-jet method or the like. Note that the light-shielding conductive film to be the first conductive layer 102 may be formed to have either a single-layer structure or a layered structure including a plurality of layers. Here, the conductive film is formed to have a three-layer structure in which an Al layer is sandwiched between Ti layers, for example. Note that the first conductive layer 102 forms at least a first gate electrode.

The first insulating layer 104 may be formed using an insulating material (e.g., silicon nitride, silicon nitride oxide, silicon oxynitride, or silicon oxide). Note that the first insulating layer 104 may be formed to have either a single-layer structure or a layered structure including a plurality of layers. Here, the first insulating layer 104 is formed to have two-layer structure in which a silicon oxynitride layer is stacked over a silicon nitride layer, for example. Note that the first insulating layer 104 forms at least a first gate insulating layer.

"Silicon nitride oxide" contains oxygen and nitrogen so that the nitrogen content is higher than the oxygen content, and in the case where measurements are performed using Rutherford backscattering spectrometry (RBS) and hydrogen forward scattering (HFS), preferably contains oxygen, nitrogen, silicon, and hydrogen at 5 at. % to 30 at. %, 20 at. % to 55 at. %, 25 at. % to 35 at. %, and 10 at. % to 30 at. %, respectively.

"Silicon oxynitride" contains oxygen and nitrogen so that the oxygen content is higher than the nitrogen content, and in the case where measurements are performed using RBS and HFS, preferably contains oxygen, nitrogen, silicon, and hydrogen at 50 at. % to 70 at. %, 0.5 at. % to 15 at. %, 25 at. % to 35 at. %, and 0.1 at. % to 10 at. %, respectively.

Note that percentages of nitrogen, oxygen, silicon, and hydrogen fall within the ranges given above, where the total number of atoms contained in the silicon oxynitride or the silicon nitride oxide is defined as 100 at. %.

Figure 2B:
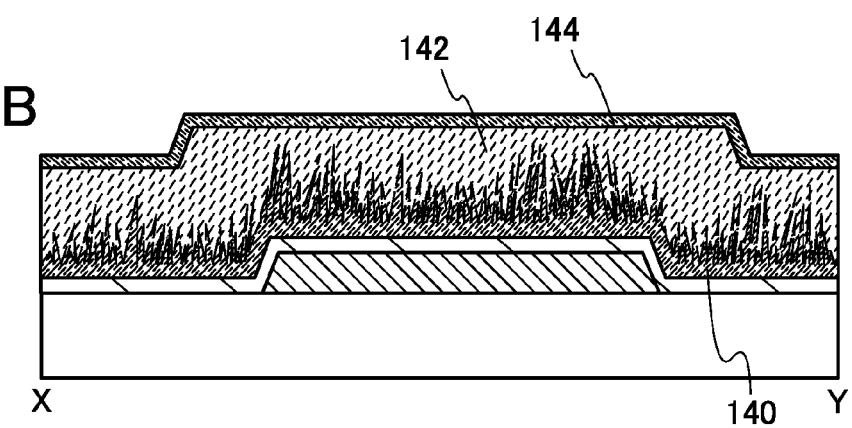

Next, over the first insulating layer 104, a crystalline semiconductor film 140 to be the crystalline semiconductor layer 106, a film 142 containing an amorphous semiconductor to be the layer 108 containing an amorphous semiconductor, and an impurity semiconductor film 144 to be the impurity semiconductor layer 110 are formed (FIG. 2B).

The crystalline semiconductor film 140 is preferably formed using a crystalline semiconductor. As the crystalline semiconductor, a microcrystalline semiconductor can be given, for example. Here, a microcrystalline semiconductor is a semiconductor having an intermediate structure between an amorphous structure and a crystalline structure (including a single crystal structure and a polycrystalline structure). A microcrystalline semiconductor is a semiconductor having a third state that is stable in terms of free energy and is a crystalline semiconductor having short-range order and lattice distortion, in which columnar or needle-like crystals having a grain size of 2 nm or more and 200 nm or less, preferably 10 nm or more and 80 nm or less, more preferably 20 nm or more and 50 nm or less have grown in a direction of the normal to the substrate surface. Thus, there is a case where crystal grain boundaries are formed at the interface of the columnar or needle-like crystal grains. Note that the diameter of the grain here means the maximum diameter of the crystal grain in a plane parallel to the substrate surface. Further, the crystal grain includes an amorphous semiconductor region and a crystallite which is a minute crystal that can be regarded as a single crystal. The crystal grain may include a twin crystal.

Microcrystalline silicon which is one of microcrystalline semiconductors has a peak of Raman spectrum which is shifted to a lower wave number than 520 cm$^{-1}$ that represents single crystal silicon. That is, the peak of the Raman spectrum of the microcrystalline silicon exists between 520 cm$^{-1}$ which represents single crystal silicon and 480 cm$^{-1}$ which represents amorphous silicon. Further, the microcrystalline silicon contains hydrogen or halogen of at least 1 at. % or more in order to terminate a dangling bond. Furthermore, the microcrystalline silicon contains a rare gas element such as He, Ar, Kr, or Ne to further promote lattice distortion, so that stability is increased and a favorable microcrystalline semiconductor can be obtained.

Moreover, when the concentration of oxygen and nitrogen contained in the crystalline semiconductor film 140 (measured by secondary ion mass spectrometry) is less than $1 \times 10^{18}$ cm$^{-3}$, the crystallinity of the crystalline semiconductor film 140 can be increased.

The film 142 containing an amorphous semiconductor serves as a buffer layer. The film 142 containing an amorphous semiconductor preferably includes an amorphous semiconductor and a minute semiconductor crystal grain, and has lower energy at the Urbach edge, which is measured by a constant photocurrent method (CPM) or photoluminescence spectrometry, and a smaller quantity of absorption spectra of defects, as compared to a conventional amorphous semiconductor film. That is, as compared to the conventional amorphous semiconductor film, such a semiconductor film is a well-ordered semiconductor film which has few defects and a steep tail slope of a level at a band edge (a mobility edge) in the valence band. Note that such a semiconductor film or a semiconductor layer is referred to as a "film containing an amorphous semiconductor" or a "layer containing an amorphous semiconductor" in this specification.

The film 142 containing an amorphous semiconductor is preferably a "film containing an amorphous semiconductor", a "film containing an amorphous semiconductor" which contains halogen, or a "film containing an amorphous semiconductor" which contains nitrogen, most preferably a "film containing an amorphous semiconductor" which contains an NH group or an NH$_2$ group. Note that one embodiment of the present invention is not limited thereto.

An interface region between the crystalline semiconductor film 140 and the film 142 containing an amorphous semiconductor has a microcrystalline semiconductor region and an amorphous semiconductor region filling the space between the microcrystalline semiconductor regions. Specifically, the interface region between the crystalline semiconductor film 140 and the film 142 containing an amorphous semiconductor includes a microcrystalline semiconductor region which extends in conical or pyramidal shapes from the crystalline semiconductor film 140 and a "film containing an amorphous semiconductor" which is similar to the film 142 containing an amorphous semiconductor.

By forming a buffer layer using the film 142 containing an amorphous semiconductor, the off-state current of a thin film transistor can be reduced. Further, since the interface region between the crystalline semiconductor film 140 and the film 142 containing an amorphous semiconductor has the conical or pyramidal microcrystalline semiconductor region, resistance in the vertical direction (the film thickness direction), that is, resistance between the film 142 containing an amorphous semiconductor and a source region or a drain region formed of the impurity semiconductor film 144, can be lowered. Thus, the on-state current of the thin film transistor can be increased. That is to say, as compared to the case of using the conventional amorphous semiconductor, the off-state current can be sufficiently reduced and reduction in on-state current can be suppressed; thus, switching characteristics of the thin film transistor can be improved.

A large portion of the above microcrystalline semiconductor region preferably includes a crystal grain having a conical or pyramidal shape whose top gets narrower from the first insulating layer 104 toward the film 142 containing an amorphous semiconductor. Alternatively, the large portion of the above microcrystalline semiconductor region may include a crystal grain having a conical or pyramidal shape whose top gets wider from the first insulating layer 104 toward the film 142 containing an amorphous semiconductor.

When the microcrystalline semiconductor region includes a crystal grain having a conical or pyramidal shape whose top gets narrower from the first insulating layer 104 toward the film 142 containing an amorphous semiconductor in the interface region between the crystalline semiconductor film 140 and the film 142 containing an amorphous semiconductor, the proportion of the microcrystalline semiconductor region on the crystalline semiconductor film 140 side is higher than that on the film 142 containing an amorphous semiconductor side. The microcrystalline semiconductor region grows from a surface of the crystalline semiconductor film 140 in the film thickness direction. When the flow rate of hydrogen with respect to that of silane in a source gas is low (that is, the dilution ratio is low) or the concentration of a source gas containing nitrogen is high, crystal growth of the microcrystalline semiconductor region is suppressed, and thus, a crystal grain comes to have a conical or pyramidal shape, and a large portion of the deposited semiconductor is amorphous.

The interface region between the crystalline semiconductor film 140 and the film 142 containing an amorphous semiconductor preferably contains nitrogen, in particular, an NH group or an NH$_2$ group. This is because defects are reduced and carriers flow easily when nitrogen, in particular, an NH group or an NH$_2$ group is bonded with dangling bonds of silicon atoms at an interface of crystal included in the microcrystalline semiconductor region and at an interface between the microcrystalline semiconductor region and the amorphous semiconductor region. Accordingly, by setting the concentration of nitrogen, preferably, an NH group or an NH$_2$ group to $1 \times 10^{20}$ cm$^{-3}$ to $1 \times 10^{21}$ cm$^{-3}$, the dangling bonds of silicon atoms can be easily cross-linked with nitrogen, preferably an NH group or an NH$_2$ group, so that carriers can flow easily. As a result, a bond which promotes the carrier transfer is formed at a crystal grain boundary or a defect, whereby the carrier mobility of the interface region between the crystalline semiconductor film 140 and the film 142 containing an amorphous semiconductor is increased. Therefore, the field effect mobility of the thin film transistor is improved.

Further, when the concentration of oxygen in the interface region between the crystalline semiconductor film 140 and the film 142 containing an amorphous semiconductor is reduced, defects at the interface between the microcrystalline semiconductor region and the amorphous semiconductor region or the interface between crystal grains can be reduced, so that bonds which inhibit carrier transfer can be reduced.

Here, when the distance from the interface between the first insulating layer 104 and the crystalline semiconductor film 140 to the interface between the crystalline semiconductor film 140 and the film 142 containing an amorphous semiconductor (e.g., the edges of the microcrystalline semiconductor regions which extend in conical or pyramidal shapes from the crystalline semiconductor film 140) is greater than or equal to 3 nm and less than or equal to 80 nm, preferably greater than or equal to 5 nm and less than or equal to 30 nm, the off-state current of the thin film transistor can be effectively reduced.

The impurity semiconductor film 144 is formed using a semiconductor to which an impurity element imparting one conductivity type is added. When the thin film transistor is an n-channel transistor, silicon to which P and As are added is used as the impurity element imparting one conductivity type, for example. Meanwhile, when the transistor is a p-channel transistor, for example, B can be added as the impurity element imparting one conductivity type, for example. Note that it is preferable that the transistor be an n-channel transistor. Therefore, for example, silicon to which P is added is used here. The impurity semiconductor film 144 may be formed using an amorphous semiconductor or a crystalline semiconductor such as a microcrystalline semiconductor.

When the impurity semiconductor film 144 is formed using an amorphous semiconductor, the flow rate of a dilution gas is greater than or equal to that of a deposition gas and less than 10 times that of the deposition gas, preferably greater than or equal to that of the deposition gas and less than or equal to 5 times that of the deposition gas. When the impurity semiconductor film 144 is formed using a crystalline semiconductor, the flow rate of the dilution gas is greater than or equal to 10 times that of a deposition gas and less than or equal to 2000 times that of the deposition gas, preferably greater than or equal to 50 times that of the deposition gas and less than or equal to 200 times that of the deposition gas.

Figure 2C:
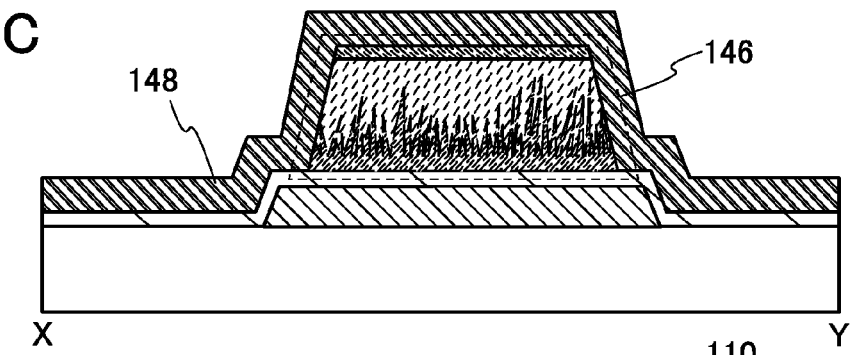

Next, a resist mask is formed over the impurity semiconductor film 144, and the crystalline semiconductor film 140, the film 142 containing an amorphous semiconductor, and the impurity semiconductor film 144 are etched using the resist mask, so that the thin film layered body 146 is formed. Then, a conductive film 148 is formed over the first insulating layer 104 and the thin film layered body 146 (FIG. 2C).

The conductive film 148 may be formed using a conductive material (e.g., metal or a semiconductor to which an impurity element imparting one conductivity type is added) in a manner similar to that of the first conductive layer 102. However, the conductive film 148 is not limited to a light-shielding conductive film. Note that the conductive film 148 may have a single-layer structure or a layered structure including plural layers. Here, a three-layer structure in which an Al layer is sandwiched between Ti layers is employed, for example.

Then, a resist mask is formed over the conductive film 148, and the conductive film 148 is etched using the resist mask, whereby the second conductive layer 112 is formed. Further, in the above step, an upper portion of the thin film layered body 146 may also be etched so that the crystalline semiconductor layer 106, the layer 108 containing an amorphous semiconductor, and the impurity semiconductor layer 110 are formed. Alternatively, after removal of the resist mask, etching may be performed using the second conductive layer 112 as a mask so that the crystalline semiconductor layer 106, a layer 108 containing an amorphous semiconductor, and the impurity semiconductor layer 110 are formed.

After that, a protective insulating film is formed so as to cover these layers. Note that the second conductive layer 112 forms at least source and drain electrodes of the thin film transistor.

Note that in the following description, a method for manufacturing a photoelectric conversion element and a method for manufacturing a thin film transistor will be described with reference to respective drawings. That is to say, FIGS. 3A to 3C illustrate a method for manufacturing a photoelectric conversion element, and FIGS. 4A to 4C illustrate a method for manufacturing a thin film transistor.

Figure 3A:
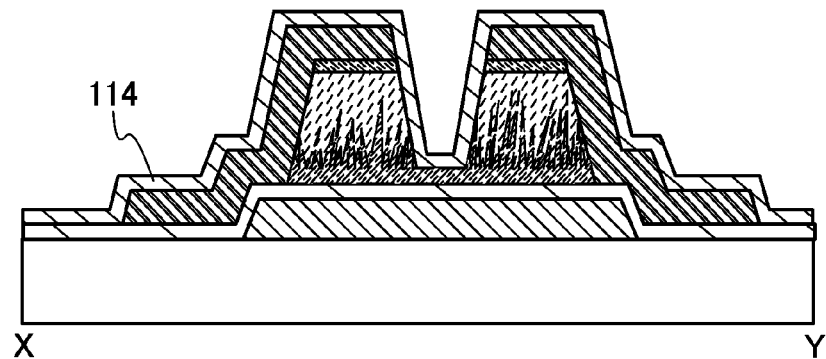
FIGS. 3A to 3C are second diagrams illustrating a method for manufacturing the photoelectric conversion element in FIGS. 1A and 1B.
Figure 3B:
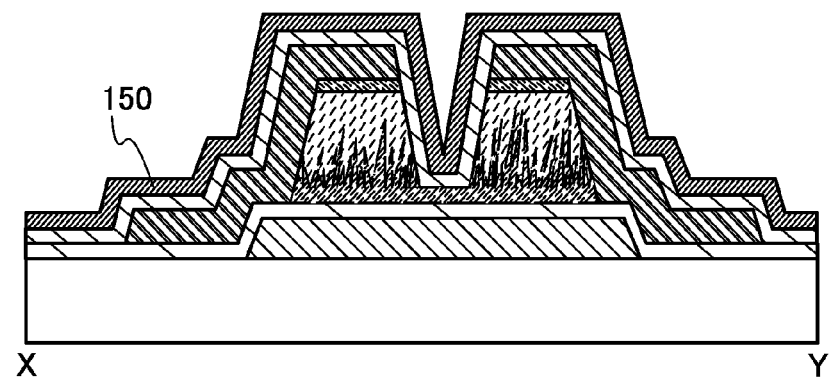
Figure 3C:
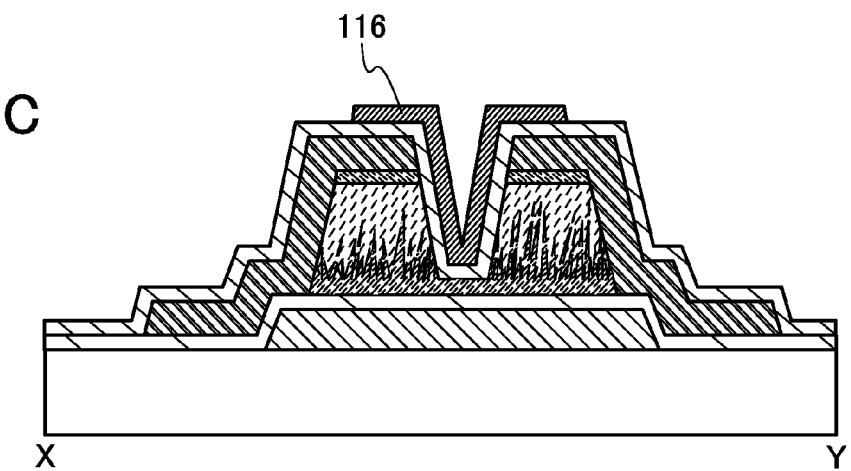
Figure 4A:
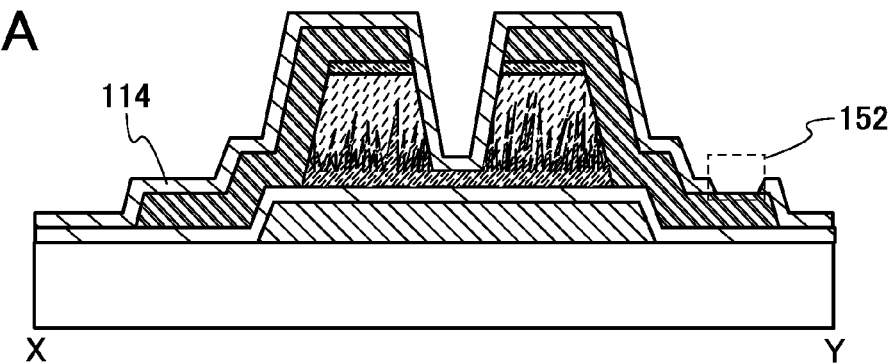
FIGS. 4A to 4C are third diagrams illustrating a method for manufacturing a thin film transistor provided over the same substrate as the photoelectric conversion element in FIGS. 1A and 1B.
Figure 4B:
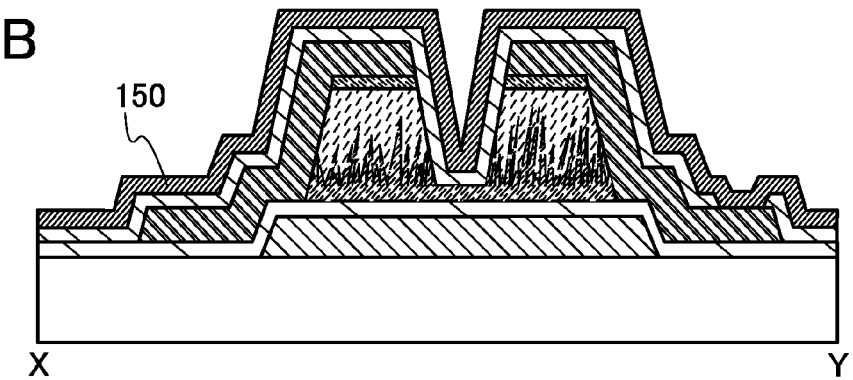
Figure 4C:
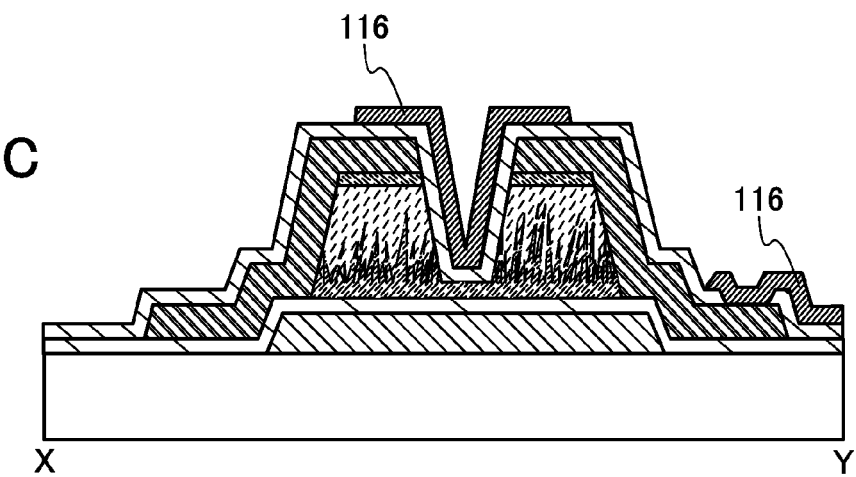

Next, a plurality of openings (e.g., an opening 152) is formed in the protective insulating film, whereby the insulating layer 114 is formed (FIG. 3A and FIG. 4A). The plurality of openings is formed in such a manner that a resist mask is formed over the protective insulating film and etching is performed using the resist mask. A plurality of openings may be formed through the same etching process for simplification of a process.

Then, a light-transmitting conductive film 150 to be the third conductive layer 116 is formed over the second insulating layer 114 in which the first opening 128, the second opening 130, and the pixel opening 152 are formed (FIGS. 1A and 1B, FIG. 3B, and FIG. 4B). The third conductive layer 116 forms at least a pixel electrode electrically connected to the pixel transistor and a second gate electrode provided to overlap with a light-receiving portion in a photoelectric conversion element. Therefore, the light-transmitting conductive film 150 to be the third conductive layer 116 is formed using a light-transmitting material.

The light-transmitting conductive film 150 can be formed using a conductive composition including a conductive macromolecule (also referred to as a conductive polymer) having a light-transmitting property. It is preferable that the light-transmitting conductive film 150 formed using the conductive composition have a sheet resistance of less than or equal to 10000 a/square and a light transmittance of greater than or equal to 70% at a wavelength of 550 nm. Further, the resistivity of the conductive macromolecule included in the conductive composition is preferably less than or equal to 0.1 Ω·cm.

As the conductive macromolecule, a so-called π-electron conjugated conductive polymer can be used. For example, polyaniline or a derivative thereof, polypyrrole or a derivative thereof, polythiophene or a derivative thereof, and a copolymer of two or more of aniline, pyrrole, and thiophene or a derivative thereof can be given.

The light-transmitting conductive film 150 can be formed using, for example, an indium oxide containing a tungsten oxide, an indium zinc oxide containing a tungsten oxide, an indium oxide containing a titanium oxide, an indium tin oxide containing a titanium oxide, an indium tin oxide (hereinafter referred to as ITO), an indium zinc oxide, an indium tin oxide to which a silicon oxide is added, graphene, or the like.

The light-transmitting conductive film 150 may be formed by processing a film which is formed using any of the above materials by a photolithography method.

Then, a resist mask is formed over the light-transmitting conductive film 150, and the light-transmitting conductive film 150 is etched using the resist mask, whereby the third conductive layer 116 is formed (FIG. 3C and FIG. 4C).

In a manner described above, a photoelectric conversion element (FIG. 3C) and a pixel transistor (FIG. 4C) can be provided over the substrate 100.

Although not illustrated, an insulating layer formed using an organic resin by a spin coating method or the like may be provided between the second insulating layer 114 and the third conductive layer 116.

In FIGS. 1A and 1B, though the layer 108 containing an amorphous semiconductor is not provided in the light-receiving portion 120, a photoelectric conversion element which is an embodiment of the present invention is not limited thereto, and the layer 108 containing an amorphous semiconductor may be provided in the light-receiving portion 120. That is, buffer layers need not be provided apart from each other.

Figure 7A:
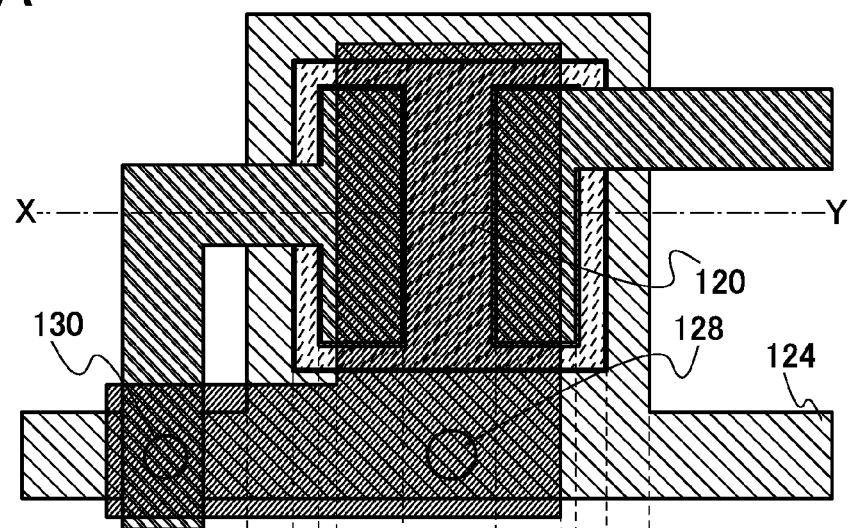
FIGS. 7A and 7B are diagrams illustrating a display device as an application example of the photoelectric conversion circuit in FIGS. 5A and 5B.
Figure 7B:
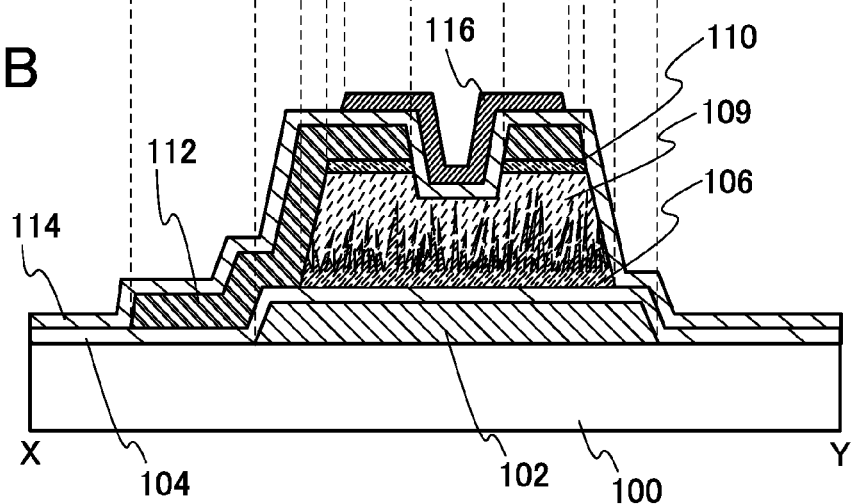

An embodiment in which the buffer layer, which is formed using the layer 108 containing an amorphous semiconductor in FIGS. 1A and 1B, is not divided is shown in FIGS. 7A and 7B. In FIGS. 7A and 7B, a layer 109 containing an amorphous semiconductor which is not divided is provided in contact with the entire surface of the crystalline semiconductor layer 106, and the impurity semiconductor layers 110 are provided in contact with the layer 109 containing an amorphous semiconductor to be apart from each other.

Note that both the first gate electrode formed using the first conductive layer 102 and the second gate electrode formed using the third conductive layer 116 do not necessarily function as a gate electrode. Therefore, either one of the potential of the first gate electrode and the potential of the second gate electrode may be in a floating state. In particular, in the case where the potential of the first gate electrode is in a floating state, the first gate electrode functions only as a light-shielding layer.

In the photoelectric conversion element in this embodiment, the entire surface of the crystalline semiconductor layer 106 and the layer 108 containing an amorphous semiconductor which are at a side opposite to the light-receiving side is shielded from light, so that generation of photocurrent by stray light is suppressed. Further, an electric field of the crystalline semiconductor layer 106 can be controlled by the second gate electrode formed using the third conductive layer 116, so that generation of unintended current in the crystalline semiconductor layer 106 can be prevented regardless of the potential of the first gate electrode even when the entire surface of the crystalline semiconductor layer 106 and the layer 108 containing an amorphous semiconductor are overlapped with the first gate electrode. Therefore, the photoelectric conversion element in this embodiment can operate keeping a high SN ratio without malfunction.

Moreover, the photoelectric conversion element in this embodiment can be manufactured over the same substrate and through the same process as the pixel transistor mounted on the display device as described in this embodiment.
(Embodiment 2)

In this embodiment, a photoelectric conversion circuit which is an embodiment of the present invention will be described. A photoelectric conversion circuit in this embodiment uses a photoelectric conversion element in Embodiment 1. Note that although a liquid crystal display device is used as an example of a display device in this embodiment, a display device is not limited thereto.

Figure 5A:
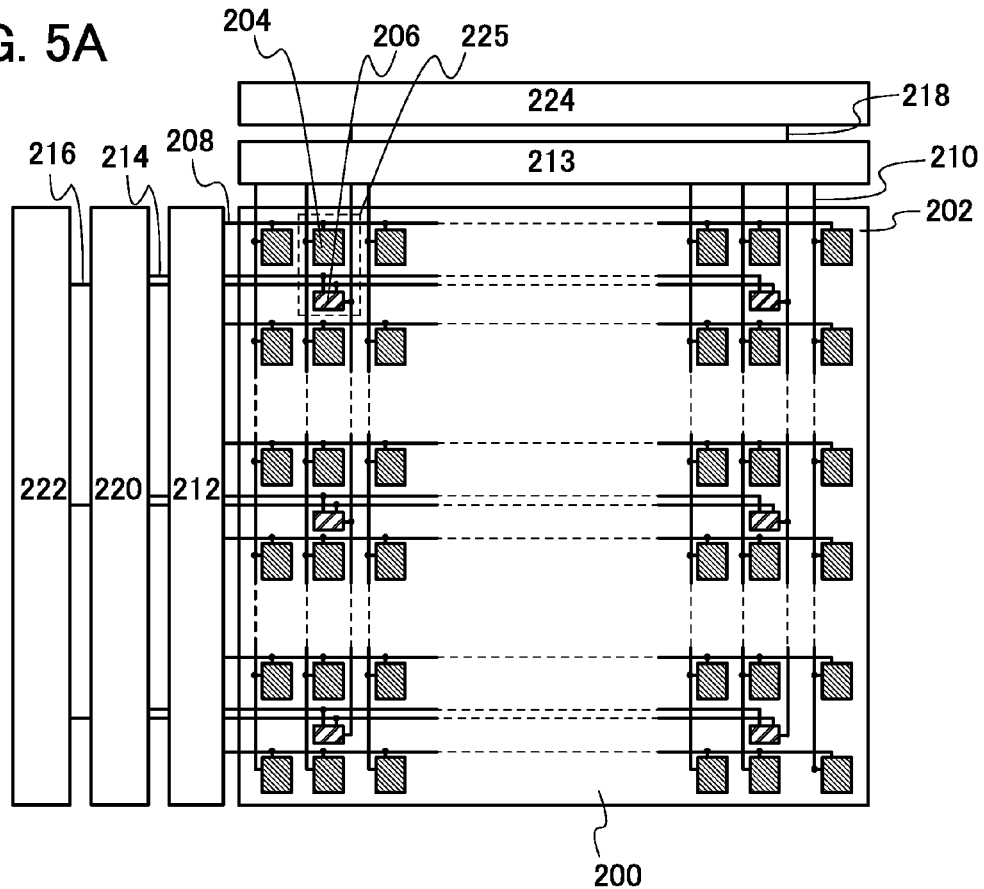
FIGS. 5A and 5B are diagrams illustrating a photoelectric conversion circuit including the photoelectric conversion element in FIGS. 1A and 1B.

FIG. 5A shows an example of a pixel structure which can be applied to the liquid crystal display device.

In the liquid crystal display device in FIG. 5A, a display portion 202 is provided over an element substrate 200, and pixel circuits 204 are arranged in matrix in the display portion 202. The pixel circuits 204 each include a pixel transistor, and the pixel transistor is electrically connected to a gate line 208 and a source line 210. The gate line 208 is electrically connected to a gate line driver circuit 212. The source line 210 is electrically connected to a source line driver circuit 213. Further, in the display portion 202, photoelectric conversion circuits 206 are provided every a certain number of pixels, and the photoelectric conversion circuits 206 each include a photoelectric conversion element.

As the pixel transistor included in the pixel circuits 204, for example, the pixel transistor described in Embodiment 1 may be used.

As the photoelectric conversion element included in the photoelectric conversion circuits 206, for example, the photoelectric conversion element described in Embodiment 1 may be used.

The photoelectric conversion circuits 206 are electrically connected to a reset line 214 that inputs a reset potential, a select line 216 that inputs a select potential for scanning, and a read line 218 that outputs an electric signal generated by the photoelectric conversion.

The reset line 214 is electrically connected to a reset circuit 220 for photoelectric conversion elements, the select line 216 is electrically connected to a scan circuit 222 for photoelectric conversion elements, and the read line 218 is electrically connected to a reading circuit 224 for photoelectric conversion element.

In the liquid crystal display device in FIG. 5A, when an indicator such as a finger or a pen exists over the photoelectric conversion circuit 206, the value of photocurrent in the light-receiving portion of a photoelectric conversion element in the photoelectric conversion circuit changes, and an electric signal is generated in the photoelectric conversion element. The electric signal is transmitted to the reading circuit 224 for photoelectric conversion elements through the read line 218. Note that an amplifier circuit or the like is preferably provided in the reading circuit 224 for photoelectric conversion elements, because the intensity of the electric signal transmitted from the photoelectric conversion element provided in the photoelectric conversion circuit 206 is generally weak.

In general, an indicator such as a finger or a pen is larger than the pixel circuit 204, so that the number of photoelectric conversion circuits 206 need not be the same as the number of the pixel circuits 204, and can be smaller than the number of the pixel circuits 204. Therefore, one photoelectric conversion circuit may be provided for every four pixels (two rows and two columns), or one photoelectric conversion circuit may be provided for every nine pixels (three rows and three columns). The number of photoelectric conversion circuits that are to be provided may be determined as appropriate according to the size of the indicator or the like. Though the photoelectric conversion circuits 206 are arranged in matrix in this embodiment, arrangement of the photoelectric conversion circuits 206 is not limited thereto.

Figure 5B:
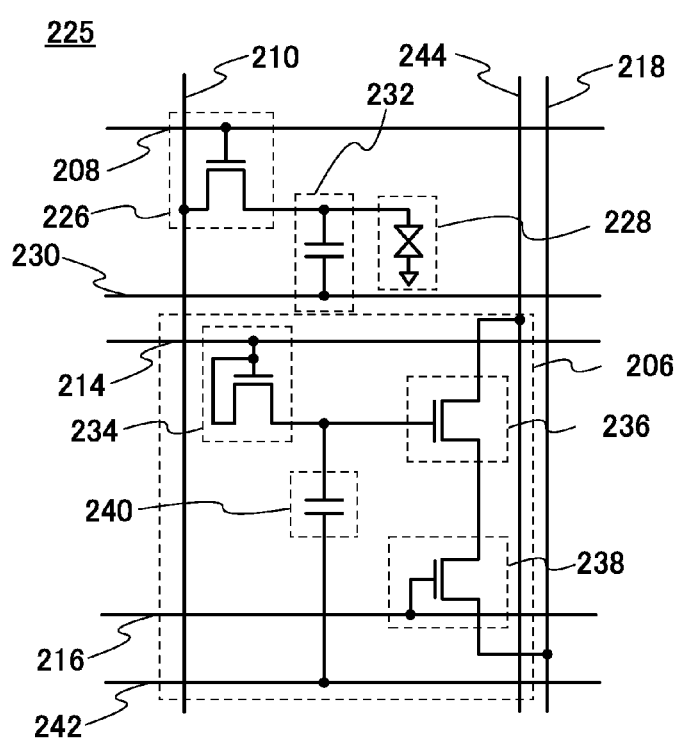

FIG. 5B is a circuit diagram illustrating a region 225 that is surrounded by a dotted line in FIG. 5A. In the region 225 surrounded by a dotted line, a pixel circuit and a photoelectric conversion circuit are provided.

In FIG. 5B, one of a source and a drain of a pixel transistor 226 which is electrically connected to the gate line 208 and the source line 210 is electrically connected to the source line 210. The other of the source and the drain of the pixel transistor 226 is electrically connected to a first electrode of a liquid crystal element 228. A second electrode of the liquid crystal element 228 is electrically connected to a counter electrode of a common potential (not illustrated). The other of the source and the drain of the pixel transistor 226 is electrically connected to a first electrode of a storage capacitor 232, and a second electrode of the storage capacitor 232 is electrically connected to a common potential line 230.

The photoelectric conversion circuit 206 includes a photoelectric conversion element 234, a thin film transistor 236, a thin film transistor 238, and a storage capacitor 240.

A gate of the photoelectric conversion element 234 is electrically connected to the reset line 214, one of a source and a drain of the photoelectric conversion element 234 is electrically connected to the gate, the other of the source and the drain of the photoelectric conversion element 234 is electrically connected to a gate of the thin film transistor 236 and a first electrode of the storage capacitor 240. A second electrode of the storage capacitor 240 is electrically connected to a common potential line 242. One of a source and a drain of the thin film transistor 236 is electrically connected to a power supply potential line 244, and the other of the source and the drain of the thin film transistor 236 is electrically connected to one of a source and a drain of the thin film transistor 238. A gate of the thin film transistor 238 is electrically connected to the select line 216, and the other of the source and the drain of the thin film transistor 238 is electrically connected to the read line 218.

Note that structures of the thin film transistor 236 and the thin film transistor 238 are not particularly limited. Further, materials forming semiconductor layers used in channel formation regions of the thin film transistor 236 and the thin film transistor 238 are not particularly limited; however, it is preferable to use a structures and a material which can be formed through the same process and over the same substrate as the pixel transistor 226 and the photoelectric conversion element 234.

A structure in which the common potential line 230 also serves as the common potential line 242 is preferable because the number of common potential lines can be reduced and the aperture ratio can be improved.

Here, the operation of the photoelectric conversion circuit 206 in this embodiment will be described. In the photoelectric conversion circuit 206 in this embodiment, laser light can be an indicator. Then, here, a mode in which laser light is used as the indicator will be described.

In the following description, the pixel transistor 226, the photoelectric conversion element 234, the thin film transistor 236 and the thin film transistor 238 are n-channel transistor; however, these transistors are not limited thereto.

FIG. 6 is a timing chart illustrating the operation of the photoelectric conversion circuit 206.

First, when the reset line 214 is set to "High" potential, the portion which is electrically connected to the first electrode of the storage capacitor 240 is electrically connected to the reset line 214 through the photoelectric conversion element 234, and the potential of the portion becomes high. When a potential difference between the potential of the portion and a potential of the source of the thin film transistor 236 (a gate voltage of the thin film transistor 236) becomes higher than or equal to a threshold voltage of the thin film transistor 236, the thin film transistor 236 is turned on. When the thin film transistor 236 is turned on, a wiring between the thin film transistor 236 and the thin film transistor 238 is electrically connected to the power supply potential line 244, charge is stored in the wiring between the thin film transistor 236 and the thin film transistor 238, and the potential of the wiring becomes high. This period is referred to as a charging period. The charging period is set on a certain cycle.

After the charging period, when the select line 216 is set to "High" potential, the thin film transistor 238 is turned on. When the thin film transistor 238 is turned on, the potential of the read line 218 becomes high by the charge stored in the wiring between the thin film transistor 236 and the thin film transistor 238, in the case where the light-receiving portion of the photoelectric conversion element 234 is not irradiated with laser light. Accordingly, whether light irradiation to the photoelectric conversion element 234 has been performed can be judged by the potential of the read line 218 at that time. At this time, the potential of the read line 218 is not constant, and decreased in a reading period, because the potential stored in the wiring between the thin film transistor 236 and the thin film transistor 238 is finite.

On the other hand, in the case where the light-receiving portion of the photoelectric conversion element 234 is irradiated with laser light and a photocurrent is generated, a reverse saturation current is generated. Then, charge is not supplied sufficiently from the photoelectric conversion element 234 to the portion which is electrically connected to the first electrode of the storage capacitor 240, and the gate of the thin film transistor 236 which is electrically connected to the first electrode of the storage capacitor 240 does not become "High" potential, so that the thin film transistor 236 is not turned on. Therefore, charge is not stored in the wiring between the thin film transistor 236 and the thin film transistor 238, and the potential of the read line 218 is not changed.

In this manner, the potential of the read line 218 is not changed in the case where the light-receiving portion of the photoelectric conversion element 234 receives light, and the potential of the read line 218 becomes high in the case where the light-receiving portion of the photoelectric conversion element 234 does not receive light. Therefore, by judging the potential of the read line 218 at certain timing with the use of the reading circuit 224 for the photoelectric conversion element, whether the light-receiving portion of the photoelectric conversion element 234 has received light can be judged.

Here, the reading circuit 224 for the photoelectric conversion element may judge only whether light irradiation has been performed by whether the potential of the read line 218 is higher than or equal to the predetermined threshold value, or may judge the degree of light by the potential of the read line 218.

In the photoelectric conversion circuit in this embodiment, the timing of the signal of the gate line 208 can differ from the timing of the signal of the select line 216, because the gate line 208 and the select line 216 are provided as different independent wirings. Therefore, crosstalk and a voltage drop can be suppressed. Moreover, in the case where one photoelectric conversion circuit is provided for every two or more pixels, a reading period can be set long.

In this embodiment, the photoelectric conversion element 234 in FIGS. 1A and 1B is used. As a result, the electric field of the semiconductor layer can be controlled by the second gate electrode, so that generation of unintended current in the crystalline semiconductor layer 106 can be prevented regardless of the potential of the first gate electrode even when the entire surface of the semiconductor layer is overlapped with the first gate electrode. Therefore, by using the photoelectric conversion element in FIGS. 1A and 1B as the photoelectric conversion element 234, the photoelectric conversion circuit in this embodiment can operate keeping a high SN ratio without malfunction.

Note that in the case where the adjacent photoelectric conversion circuits 206 are selected sequentially at a constant cycle by the select line 216, continuous changes of laser light can also be detected.

In FIG. 5B, one photoelectric conversion element is provided in one photoelectric conversion circuit; however a mode is not limited thereto, and a plurality of photoelectric conversion elements may be provided in one photoelectric conversion circuit.

Note that the storage capacitor 240 need not be provided if not necessary. If the capacitance value of the photoelectric conversion element 234 is sufficient, and the potential of the read line 218 can be judged whether a "High" potential or a "Low" potential, the storage capacitor 240 need not be provided.

EXAMPLE 1

In the photoelectric conversion element which is an embodiment of the present invention, unintended current in the semiconductor layer forming the light-receiving portion can be suppressed by providing both the first gate electrode and the second gate electrode as shown in FIGS. 1A and 1B, which will be described in this example based on experimental data.

In this example, three kinds of samples were manufactured. Sample 1 was a dual-gate structure in which both the first gate electrode and the second gate electrode are provided in the photoelectric conversion element. Sample 2 was a top-gate structure in which only the second gate electrode is provided in the photoelectric conversion element. Sample 3 was a bottom-gate structure in which only the first gate electrode is provided in the photoelectric conversion element.

Methods for manufacturing the photoelectric conversion elements of Samples 1 to 3 (the photoelectric conversion element 234 in FIG. 5B) will be described below with reference to FIGS. 2A to 2D and FIGS. 3A to 3C.

First, a base insulating film (not illustrated) was formed over the substrate 100. Then, the first conductive layer 102 was formed over the base insulating film for Sample 1 and Sample 3.

A glass substrate (EAGLE XG manufactured by Corning Incorporated) was used as the substrate 100.

The base insulating film was a silicon oxynitride film formed by a plasma CVD method.

The first conductive layer 102 had a three-layer structure in which an Al layer with a thickness of 100 nm was interposed between Ti layers with a thickness of 50 nm. The Al layer and the Ti layers were formed as follows: stacking an Al film and Ti films by a sputtering method using an argon gas; forming a resist mask over the stacked-layer film; performing etching using a mixed gas of boron trichloride gas and chlorine gas; and performing etching using carbon tetrafluoride gas. The etching was performed using an ICP apparatus. The resist mask was removed after the etching.

Next, the first insulating layer 104 was formed so as to cover the first conductive layer 102 for Sample 1 and Sample 3 (FIG. 2A).

The first insulating layer 104 was a silicon nitride film with a thickness of 300 nm. The silicon nitride film was formed by a plasma CVD method using a parallel plate plasma treatment apparatus under the following conditions: silane gas, hydrogen gas, nitrogen gas, and ammonia gas were set at flow rates of 15 sccm, 200 sccm, 180 sccm, and 500 sccm, respectively; the pressure in the process chamber was 100 Pa; the RF power source frequency was 13.56 MHz; and the power of the RF power source was 200 W. Here, the upper electrode temperature was 250° C., the lower electrode temperature was 290° C., and the distance between the upper electrode and the lower electrode was 30 mm.

After that, plasma treatment was performed using dinitrogen monoxide on the surface over which the crystalline semiconductor film 140 is to be formed (the first insulating layer 104 in Sample 1 and Sample 3, the base insulating film in Sample 2). In the plasma treatment, plasma discharge was performed for three minutes using a parallel plate plasma treatment apparatus under the following conditions: the flow rate of dinitrogen monoxide gas was set to be 400 sccm; the pressure in the process chamber was 60 Pa; the RF power source frequency was 13.56 MHz; and the power of the RF power source was 300 W. Here, the upper electrode temperature was 250° C., the lower electrode temperature was 290° C., and the distance between the upper electrode and the lower electrode was 30 mm.

Note that the process from the following process up to and including the step of forming the light-transmitting conductive film 150 was performed to all of Samples 1 to 3.

Next, the crystalline semiconductor film 140, the film 142 containing an amorphous semiconductor, and the impurity semiconductor film 144 were formed (FIG. 2B). First, the crystalline semiconductor film 140 was formed in two steps (the first formation step and the second formation step).

The first step of forming the crystalline semiconductor film 140 is a step of forming a seed crystal so that the average thickness thereof is approximately 5 nm. The first step of forming the crystalline semiconductor film 140 by a plasma CVD method using a parallel plate plasma treatment apparatus performed under the following conditions: silane gas, hydrogen gas, and argon gas were set at flow rates of 6 sccm, 750 sccm, and 750 sccm, respectively; the pressure in the process chamber was 532 Pa; the RF power source frequency was 13.56 MHz; and the power of the RF power source was 250 W. Here, the upper electrode temperature was 250° C., the lower electrode temperature was 290° C., and the distance between the upper electrode and the lower electrode was 15 mm.

The second step of forming the crystalline semiconductor film 140 is a step of growing the seed crystal so that the thickness of the crystalline semiconductor film is approximately 65 nm. The second step of forming the crystalline semiconductor film 140 was performed by a plasma CVD method using a parallel plate plasma treatment apparatus performed under the following conditions: the flow rates of silane gas, hydrogen gas, and argon gas were set to be 1.8 sccm, 750 sccm, and 750 sccm, respectively; the pressure in the process chamber was 5000 Pa; the RF power source frequency was 13.56 MHz; and the power of the RF power source was 125 W. Here, the upper electrode temperature was 250° C., the lower electrode temperature was 290° C., and the distance between the upper electrode and the lower electrode was 7 mm.

Next, the film 142 containing an amorphous semiconductor with a thickness of 80 nm was formed over the crystalline semiconductor film 140. The film 142 containing an amorphous semiconductor was formed by a plasma CVD method using a parallel plate plasma treatment apparatus under the following conditions: the flow rates of silane gas, 1000 ppm ammonia gas (diluted with hydrogen gas), hydrogen gas, and argon gas were set to be 20 sccm, 50 sccm, 700 sccm, and 750 sccm, respectively; the pressure in the process chamber was 350 Pa; the RF power source frequency was 13.56 MHz; and the power of the RF power source was 60 W. Here, the upper electrode temperature was 250° C., the lower electrode temperature was 290° C., and the distance between the upper electrode and the lower electrode was 25 mm.

Note that the microcrystalline semiconductor region which extends in a conical or pyramidal shape from the crystalline semiconductor film 140 was formed by stacking the film 142 containing an amorphous semiconductor over the crystalline semiconductor film 140.

Next, the impurity semiconductor film 144 with a thickness of 50 nm was formed over the film 142 containing an amorphous semiconductor. The impurity semiconductor film 144 was formed using a parallel plate plasma treatment apparatus under the following conditions: the flow rates of silane gas, 5% phosphine gas (diluted with silane gas), and hydrogen gas were set to be 80 sccm, 50 sccm, and 750 sccm, respectively; the pressure in the process chamber was 1250 Pa; the RF power source frequency was 13.56 MHz; and the power of the RF power source was 60 W. Here, the upper electrode temperature was 250° C., the lower electrode temperature was 290° C., and the distance between the upper electrode and the lower electrode was 15 mm.

Next, a resist mask was formed over the impurity semiconductor film 144, the thin film layered body 146 was formed by etching the crystalline semiconductor film 140, the film 142 containing an amorphous semiconductor using the resist mask, and the impurity semiconductor film 144, and the conductive film 148 was formed over the first insulating layer 104 and the thin film layered body 146 (FIG. 2C).

Here, a mixed gas of boron trichloride gas, carbon tetrafluoride gas, and oxygen gas was used for the etching to form the thin film layered body 146. The etching was performed using an ICP apparatus.

After that, oxygen plasma treatment was performed, so that an oxide film was formed on side walls of the thin film layered body 146, and then the resist mask was removed. The oxygen plasma treatment was performed using a parallel plate plasma treatment apparatus under the following conditions: the flow rate of oxygen gas was set to be 100 sccm; the pressure in the process chamber was 0.67 Pa; the RF power source frequency was 13.56 MHz; and the power of the RF power source was 60 W; the source power was 2000 W; the bias power was 350 W. Here, the temperature of the substrate 100 was −10° C., and the distance between the upper electrode and the lower electrode was 15 mm. The plasma treatment was performed using an ICP apparatus.

As the conductive film 148, a stacked-layer film in which an Al layer with a thickness of 200 nm was interposed between Ti layers with a thickness of 50 nm was formed by sputtering method using argon gas.

Figure 2D:
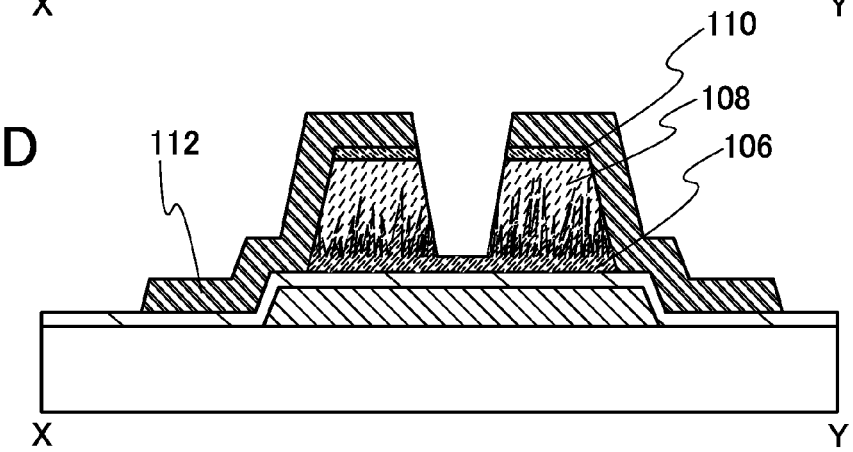

Next, a resist mask was formed over the conductive film 148 and the conductive film was etched using boron trichloride to a depth of 150 nm from the surface of the thin film layered body 146, so that the second conductive layer 112, the impurity semiconductor layer 110, the layer 108 containing an amorphous semiconductor, and the crystalline semiconductor layer 106 were formed (FIG. 2D). The etching was performed using an ICP apparatus. The resist mask was removed after the etching.

Next, water plasma treatment was performed on the surface of the crystalline semiconductor layer 106. The plasma treatment was performed under the following conditions: the flow rate of water vapor was 300 sccm; the pressure in the process chamber was 66.5 Pa; and power was 1800 W.

Next, an insulating film which becomes the second insulating layer 114 was formed. The insulating film was a silicon nitride film with a thickness of 300 nm. The silicon nitride film was formed by a plasma CVD method using a parallel plate plasma treatment apparatus under the following conditions: the flow rates of silane gas, ammonia gas, nitrogen gas, and hydrogen gas were set to be 20 sccm, 220 sccm, 450 sccm, and 450 sccm, respectively; the pressure in the process chamber was 160 Pa; the RF power source frequency was 13.56 MHz; and the power of the RF power source was 200 W. Here, the upper electrode temperature was 250° C., the lower electrode temperature was 290° C., and the distance between the upper electrode and the lower electrode was 21 mm.

Next, by forming a resist mask over the insulating film which becomes the second insulating layer 114 and etching the conductive film using a mixed gas of trifluoromethane gas and helium gas, an opening which reaches a desired portion of the second conductive layer 112 and an opening which reaches a desired portion of the first conductive layer 102 were formed; thus, the second insulating layer 114 was formed (FIG. 3A). The etching was performed using an ICP apparatus. The resist mask was removed after the etching.

Next, the light-transmitting conductive film 150 was formed over the second insulating layer 114 (FIG. 3B), and a resist mask was formed over the light-transmitting conductive film 150, and the light-transmitting conductive film 150 is etched using the resist mask. Then, the third conductive layer 116 was formed (FIG. 3C).

As the light-transmitting conductive film 150, an indium tin oxide film with a thickness of 50 nm was formed by a sputtering method using argon gas. The etching was performed by wet etching.

Note that the second gate electrode was formed in Sample 1 and Sample 2 through the steps.

The photoelectric conversion element manufactured in the above-described manner was irradiated with light, and a gate and a drain of the photoelectric conversion element were set to the same potential. In these conditions, the value of current between a source and a drain (a leakage current value) was measured.

Figure 8A:
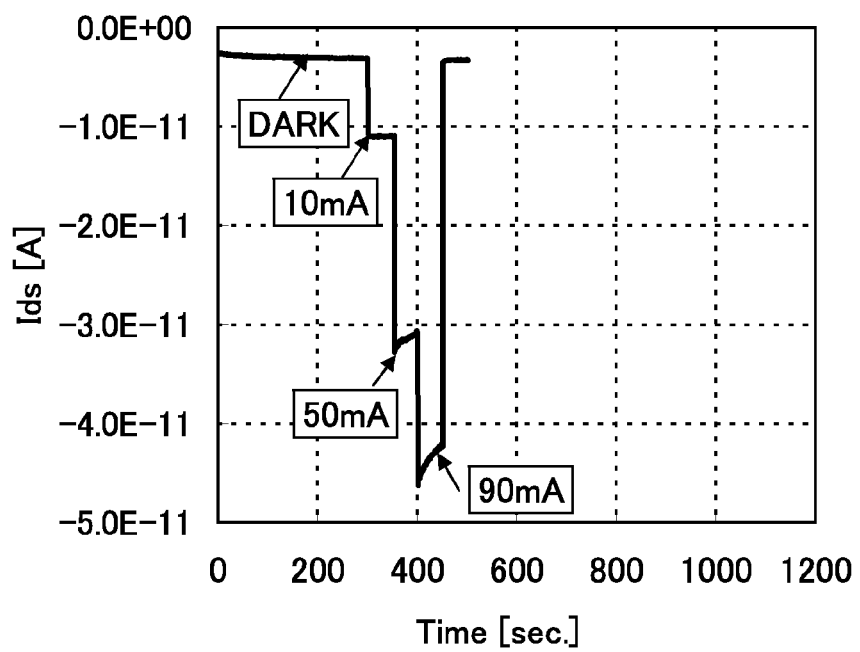
FIGS. 8A and 8B are graphs showing results of measurement of current values in light receiving of Sample 1 and Sample 2 in Example 1.

FIG. 8A shows measurement results of Sample 1 (the dual-gate structure).

Figure 8B:
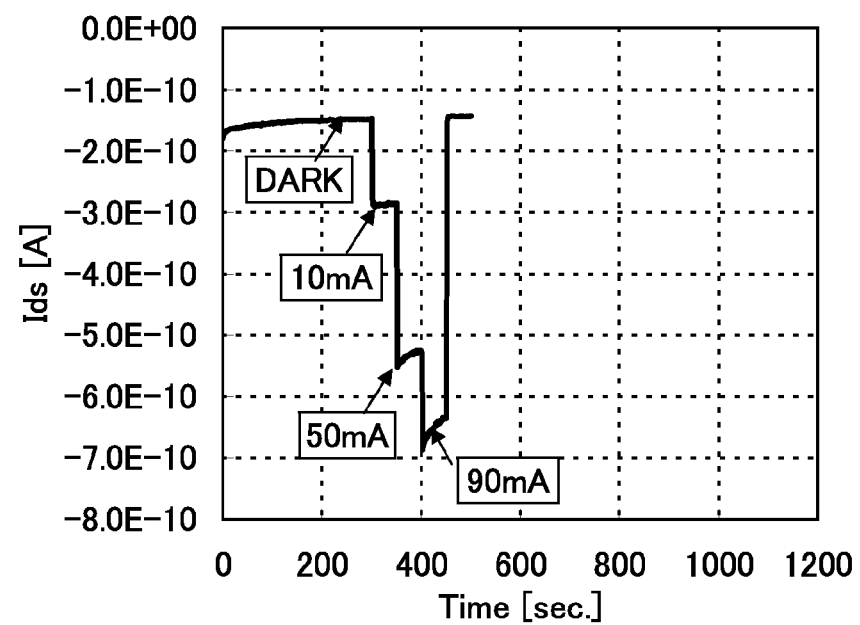
Figure 9:
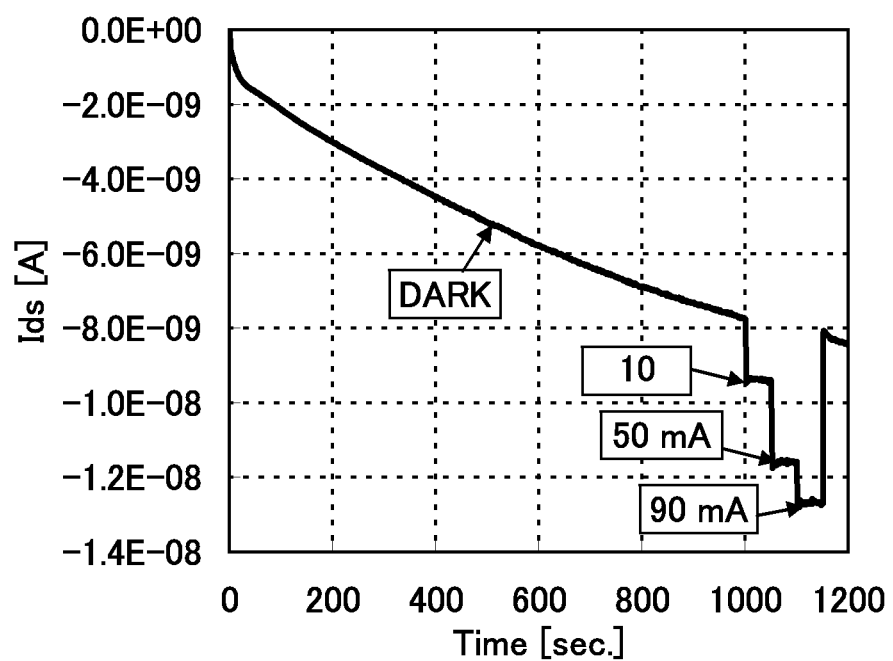
FIG. 9 is a graph showing a result of measurement of current value in light receiving of Sample 3 in Example 1.

FIG. 8B shows measurement results of Sample 2 (the top-gate structure). FIG. 9 shows measurement results of Sample 3 (the bottom-gate structure).

According to the comparison of the measurement results, in Sample 1 and Sample 2, the value of leakage current is low and current can pass speedily without delay, in channel formation regions in the photoelectric conversion element, as compared to Sample 3. Therefore, Sample 1 and Sample 2 can realize high-speed reading and operate keeping the SN ratio high.

Further, in Sample 1, the electric field of the crystalline semiconductor layer 106 can be controlled by the second gate electrode, so that generation of unintended current in the semiconductor layer can be prevented regardless of the potential of the first gate electrode even when the entire surface of the semiconductor layer is overlapped with the first gate electrode.

This application is based on Japanese Patent Application serial no. 2010-275311 filed with Japan Patent Office on Dec. 10, 2010, the entire contents of which are hereby incorporated by reference.

What is claimed is:

1. A photoelectric conversion element comprising:
a first gate electrode;
a first gate insulating layer over the first gate electrode;
a crystalline semiconductor layer provided over the first gate insulating layer;
amorphous semiconductor layers provided apart from each other, each of the amorphous semiconductor layers being on and in contact with the crystalline semiconductor layer;
impurity semiconductor layers provided over the amorphous semiconductor layers, respectively;
a source electrode and a drain electrode, each provided in contact with one of the impurity semiconductor layers;
a second gate insulating layer provided to cover a portion of the crystalline semiconductor layer, where the amorphous semiconductor layers are not provided; and
a second gate electrode provided over the second gate insulating layer,
wherein a light-receiving portion is provided in the portion of the crystalline semiconductor layer, where the amorphous semiconductor layers are not provided,
wherein the first gate electrode includes a light-shielding material and is provided to entirely overlap with the crystalline semiconductor layer and the amorphous semiconductor layers,
wherein the second gate electrode includes a light-transmitting material and is provided to overlap with the light-receiving portion, and
wherein the first gate electrode is electrically connected to one of the source electrode and the drain electrode.

2. The photoelectric conversion element according claim 1, wherein the impurity semiconductor layers are not provided in the portion of the crystalline semiconductor layer.

3. The photoelectric conversion element according claim 1, wherein the crystalline semiconductor layer comprises microcrystalline semiconductor.

4. The photoelectric conversion element according claim 1, wherein the second gate electrode is electrically connected to one of the source electrode and the drain electrode.

5. The photoelectric conversion element according claim 1, wherein the second gate electrode is electrically connected to the first gate electrode.

6. The photoelectric conversion element according claim 1, wherein an interface region between the crystalline semiconductor layer and one of the amorphous semiconductor layers has a conical or pyramidal microcrystalline semiconductor region.

7. The photoelectric conversion element according claim 6, wherein the interface region contains an NH group or an $NH_2$ group.

8. A photoelectric conversion circuit comprising:
the photoelectric conversion element according to claim 1, wherein the first gate electrode is electrically connected to a reset line;
a storage capacitor in which the other of the source electrode and the drain electrode of the photoelectric conversion element is electrically connected to a first electrode and a common potential line is electrically connected to a second electrode;
a first thin film transistor in which a gate is electrically connected to the other of the source electrode and the drain electrode of the photoelectric conversion element and one of a source and a drain of the first thin film transistor is electrically connected to a power supply potential line; and
a second thin film transistor in which a gate is electrically connected to a select line, one of a source and a drain of the second thin film transistor is electrically connected to the other of the source and the drain of the first thin film transistor, and the other of the source and the drain of the second thin film transistor is electrically connected to a reading line.

9. A display device including the photoelectric conversion circuit according to claim 8.

10. A photoelectric conversion element comprising:
a first conductive layer over a substrate;
a first insulating layer over the first conductive layer;
a crystalline semiconductor layer over the first insulating layer;
first and second amorphous semiconductor layers on first and second portions of the crystalline semiconductor layer, the first and second portions provided apart from each other;
first and second impurity semiconductor layers on the first and second amorphous semiconductor layers, respectively;
second conductive layers on the first and second impurity semiconductor layers, one of the second conductive layers being in contact with the first insulating layer;
a second insulating layer over the second conductive layers and being in contact with a third portion of the crystalline semiconductor layer, the third portion provided between the first and second portions of the crystalline semiconductor layer; and
a third conductive layer over the second insulating layer and the third portion of the crystalline semiconductor layer.

11. The photoelectric conversion element according to claim 10, wherein the crystalline semiconductor layer comprises microcrystalline semiconductor.

12. The photoelectric conversion element according claim 10 wherein the third conductive layer is electrically connected to one of the second conductive layers.

13. The photoelectric conversion element according claim 10, wherein the third conductive layer is electrically connected to the first conductive layer.

14. The photoelectric conversion element according to claim 10, wherein interface regions between the crystalline semiconductor layer and the first and second amorphous semiconductor layers have conical or pyramidal microcrystalline semiconductor regions.

15. The photoelectric conversion element according claim 14, wherein each of the interface regions contains an NH group or an $NH_2$ group.

* * * * *